United States Patent
Anderson et al.

(10) Patent No.: US 12,020,985 B2
(45) Date of Patent: Jun. 25, 2024

(54) TRANSFERRING LARGE-AREA GROUP III-NITRIDE SEMICONDUCTOR MATERIAL AND DEVICES TO ARBITRARY SUBSTRATES

(71) Applicant: The Government of the United States of America, as represented by the Secretary of the Navy, Arlington, VA (US)

(72) Inventors: Travis J. Anderson, Alexandria, VA (US); Marko J. Tadjer, Vienna, VA (US); Karl D. Hobart, Alexandria, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 439 days.

(21) Appl. No.: 17/327,816

(22) Filed: May 24, 2021

(65) Prior Publication Data

US 2021/0375680 A1   Dec. 2, 2021

Related U.S. Application Data

(60) Provisional application No. 63/031,793, filed on May 29, 2020.

(51) Int. Cl.
*B29C 65/00* (2006.01)
*C30B 29/40* (2006.01)
(Continued)

(52) U.S. Cl.
CPC ........ *H01L 21/7813* (2013.01); *C30B 29/406* (2013.01); *H01L 21/0242* (2013.01);
(Continued)

(58) Field of Classification Search
CPC ............. B32B 43/006; Y10T 156/1153; Y10T 156/1168; Y10T 156/1911; B29C 65/02
See application file for complete search history.

(56) References Cited

U.S. PATENT DOCUMENTS 6,328,796 B1  12/2001  Kub et al.
6,497,762 B1  12/2002  Okutani et al.
(Continued)

OTHER PUBLICATIONS

Search Report and Written Opinion mailed Sep. 15, 2021 in corresponding International Application No. PCT/US2021/033809.
(Continued)

*Primary Examiner* — Philip C Tucker
*Assistant Examiner* — Nickolas R Harm
(74) *Attorney, Agent, or Firm* — US Naval Research Laboratory; Joslyn J. Barritt (57) ABSTRACT

Methods for obtaining a free-standing thick (>5 µm) epitaxial material layer or heterostructure stack and for transferring the thick epitaxial layer or stack to an arbitrary substrate. A thick epitaxial layer or heterostructure stack is formed on an engineered substrate, with a sacrificial layer disposed between the epitaxial layer and the engineered substrate. When the sacrificial layer is removed, the epitaxial layer becomes a thick freestanding layer that can be transferred to an arbitrary substrate, with the remaining engineered substrate being reusable for subsequent material layer growth. In an exemplary case, the material layer is a GaN layer and can be selectively bonded to an arbitrary substrate to selectively produce a Ga-polar or an N-polar GaN layer.

18 Claims, 7 Drawing Sheets

(51) Int. Cl.
*H01L 21/02* (2006.01)
*H01L 21/48* (2006.01)
*H01L 21/78* (2006.01)
*H01L 23/373* (2006.01)
*H01L 29/20* (2006.01)
*H01L 29/24* (2006.01)
*H01L 29/778* (2006.01)
*H01L 29/872* (2006.01)
*B29C 65/02* (2006.01)
*B32B 43/00* (2006.01)

(52) U.S. Cl.
CPC .... *H01L 21/0254* (2013.01); *H01L 21/02568* (2013.01); *H01L 21/4807* (2013.01); *H01L 23/3732* (2013.01); *H01L 29/2003* (2013.01); *H01L 29/24* (2013.01); *H01L 29/7786* (2013.01); *H01L 29/872* (2013.01); *B29C 65/02* (2013.01); *B32B 43/006* (2013.01); *Y10T 156/1168* (2015.01); *Y10T 156/1911* (2015.01)

(56) References Cited

U.S. PATENT DOCUMENTS

| | | | |
|---|---|---|---|
| 6,497,763 B2 | 12/2002 | Kub et al. | |
| 7,535,100 B2 | 5/2009 | Kub et al. | |
| 7,605,055 B2 | 10/2009 | Celler | |
| 7,723,730 B2* | 5/2010 | Groetsch | H01L 24/97 257/E33.001 |
| 9,876,081 B2 | 1/2018 | Meyer et al. | |
| 10,164,144 B2 | 12/2018 | Henley et al. | |
| 10,262,856 B2 | 4/2019 | Meyer et al. | |
| 10,340,353 B2 | 7/2019 | Meyer et al. | |
| 2002/0096106 A1* | 7/2002 | Kub | H01L 21/2007 117/94 |
| 2006/0255341 A1* | 11/2006 | Pinnington | B82Y 20/00 257/E33.068 |
| 2009/0133811 A1 | 5/2009 | Moriceau et al. | |
| 2010/0219509 A1* | 9/2010 | He | H01L 31/0735 257/E29.089 |
| 2011/0094668 A1* | 4/2011 | Le Vaillant | C30B 25/18 156/247 |
| 2011/0127581 A1* | 6/2011 | Bethoux | H01L 21/187 117/106 |
| 2011/0136281 A1* | 6/2011 | Sheen | H01L 33/0093 257/E21.328 |
| 2012/0012048 A1* | 1/2012 | Letertre | H01L 21/185 117/95 |
| 2015/0048301 A1* | 2/2015 | Kilbury | H01L 21/76259 257/618 |
| 2016/0035851 A1* | 2/2016 | Meyer | H01L 21/02505 257/77 |
| 2016/0189954 A1* | 6/2016 | Kong | H01L 21/78 438/479 |
| 2018/0366609 A1 | 12/2018 | Ritenour et al. | |
| 2019/0172923 A1 | 6/2019 | Pelzel et al. | |

OTHER PUBLICATIONS

E. A. Stach, et al., "Structural and chemical characterization of free standing GaN films separated from sapphire substrates by laser lift off," Appl. Phys. Lett. 77, 1819 (2000).

Kelly et al., "Large Free Standing GaN Substrates by Hydride Vapor Phase Epitaxy and Laser Induced Liftoff," 1999 Jpn. J. Appl. Phys. 38 L217.

D. J. Rogers et al., "Use of ZnO thin films as sacrificial templates for metal organic vapor phase epitaxy and chemical lift off of GaN," Appl. Phys. Lett. 91, 071120 (2007).

H. Goto et al., "Chemical lift off of GaN epitaxial films grown on c sapphire substrates with CrN buffer layers," Phys. Stat. Sol. (c) 5, No. 6, 1659-1661 (2008).

D. Scott Katzer et al, "Epitaxial metallic β Nb2N films grown by MBE on hexagonal SiC substrates," 2015 Appl. Phys. Express 8 085501.

Tadjer et al., "GaN On Diamond HEMT Technology With TAVG= 176° C. at PDC,max =56 W/mm Measured by Transient Thermoreflectance Imaging," IEEE Electron Device Letters, vol. 40, No. 6, p. 881 884, Jun. 2019.

* cited by examiner

Etch, then bond

↑ Ga-polar

OR

↓ N-polar

Bond, then etch

TRANSFERRING LARGE-AREA GROUP III-NITRIDE SEMICONDUCTOR MATERIAL AND DEVICES TO ARBITRARY SUBSTRATES

CROSS-REFERENCE

This Application is a Nonprovisional of and claims the benefit of priority under 35 U. S.C. § 119 based on U.S. Provisional Patent Application No. 63/031,793 filed on May 29, 2020. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case # 113139.

TECHNICAL FIELD

The present disclosure is related to semiconductor device structures, particularly to the formation of semiconductor device structures comprising epitaxial material layers on arbitrary substrates using thin film transfer techniques enabled by use of a sacrificial release layer.

BACKGROUND

GaN and related III-N semiconductor alloys (e.g. InGaN, AlGaN, InAlGaN) have many favorable properties, enabled by their tunable direct bandgap (0.7-6.1 eV), high saturation velocity, high mobility, and high breakdown field. Such properties make devices suitable for a broad range of technological applications, including optoelectronic devices, power switches, and microwave transistors. Significant technical challenges remain however, including thermal management and the cost/size of native substrates.

The lack of large-area, uniform, high quality native GaN substrates has limited the not only the development of vertical GaN technology but also the quality of heteroepitaxial GaN materials. Even though GaN is commercially available, dislocation densities remain high ($10^8$-$10^9$ cm$^{-2}$). This is the main reason commercial GaN devices remain limited main to the HEMT, whose operation does not degrade significantly by the presence of these dislocations.

The engineered substrate technology pioneered at the Naval Research Laboratory (NRL) has solved this problem by providing engineered thermally-matched substrates for heteroepitaxial GaN growth. See U.S. Pat. No. 6,328,796 to Kub et al., entitled "Single-Crystal Material On Non-Single-Crystalline Substrate"; U.S. Pat. No. 6,497,763 to Kub et al., entitled "Electronic Device With Composite Substrate"; U.S. Pat. No. 7,358,152 to Kub et al., entitled "Wafer Bonding of Thinned Electronic Materials and Circuits to High Performance Substrate"; and U.S. Pat. No. 7,535,100 to Kub et al., entitled "Wafer Bonding of Thinned Electronic Materials and Circuits to High Performance Substrates."

The integration of diamond substrates with GaN transistors for improved heat spreading is an active research area, though success has been limited. Typical approaches involve growing diamond films directly on the back side of GaN layers after substrate removal or via formation. Substrate removal and die transfer has been achieved using laser lift-off or sacrificial nucleation layers. See E. A. Stach, et al., "Structural and chemical characterization of free-standing GaN films separated from sapphire substrates by laser lift-off," *Appl. Phys. Lett.* 77, 1819 (2000); Kelly et al., "Large Free-Standing GaN Substrates by Hydride Vapor Phase Epitaxy and Laser-Induced Liftoff," 1999 *Jpn. J. Appl. Phys.* 38 L217; D. J. Rogers et al., "Use of ZnO thin films as sacrificial templates for metal organic vapor phase epitaxy and chemical lift-off of GaN," *Appl. Phys. Lett.* 91, 071120 (2007); H. Goto et al., "Chemical lift-off of GaN epitaxial films grown on c-sapphire substrates with CrN buffer layers," *Phys. Stat. Sol.* (c) 5, No. 6, 1659-1661 (2008); and D. Scott Katzer et al, "Epitaxial metallic β-Nb2N films grown by MBE on hexagonal SiC substrates," 2015 *Appl. Phys. Express* 8 085501.

These approaches suffer from two significant drawbacks. First, the substrate must be mechanically removed by back grinding and etching and cannot be reclaimed, making the use of high performance SiC or GaN substrates impractical. Second, the diamond nucleation and transition layers are typically of poor quality and reduced thermal conductivity and therefore do not take full advantage of a high thermal conductivity substrate. Third, additional stress introduced by thick CVD diamond may compromise wafer flatness specifications for downstream processing. Therefore alternative approaches to facilitate transfer of III-N films to diamond or other arbitrary substrates using sacrificial layers and direct bonding are of interest.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides methods for obtaining a free-standing thick (>5 μm) epitaxial material layer or heterostructure stack and for transferring the thick epitaxial material layer or stack to an arbitrary substrate. The present invention further provides methods for obtaining a reusable substrate comprising engineered substrate layers on a base substrate layer.

In the method of the present invention, a thick epitaxial material layer or heterostructure stack is formed on an engineered substrate, with a sacrificial layer disposed between the epitaxial layer and the engineered substrate. When the sacrificial layer is removed, the epitaxial material layer becomes a thick freestanding layer that can be transferred to an arbitrary substrate, with the remaining engineered substrate being reusable for subsequent epitaxial layer growth.

The epitaxial material layer can be unintentionally doped (UID), intentionally n-type or p-type doped, or polarization-doped. In many embodiments, it will be a III-N material layer, for example, an InAlGaN film or a heterostructure incorporating a III-N material or a combination of III-N materials, such as GaN, BN, InN, AlN, $Al_xGa_{1-x}N$ (0≤x≤1); $In_xAl_{1-x}N$ (0≤x≤1); $In_xAl_yGa_zN$ (x+y+z=1); $Sc_xAl_{1-x}$ (0≤x≤1); $B_xAl_{1-x}N$ (0≤x≤1); or $B_xAl_yGa_zN$ (x+y+z=1). In other embodiments, material layer 104 can also comprise a transition metal nitride (TMN) such as ZnN, WN, VaN, TaN, or NbN.

In an exemplary embodiment, the III-Nitride layer is a GaN layer. When the GaN layer is removed from the arbitrary substrate it can be selectively bonded to an arbitrary substrate to produce a Ga-polar or an N-polar GaN layer.

BRIEF DESCRIPTION OF THE DRAWINGS

FIGS. 6A-6C are schematics illustrating aspects of a vertical diode structure, where

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides an alternative concept for a release layer that produces an atomically flat surface, and is sufficiently thick for lift-off at the device or chip level. The method of the present invention provides a significant improvement on the formation of GaN films and their use as transferred layers in electronic devices.

While it is possible to grow GaN hetero-epitaxially on a variety of substrates such as SiC, Si, sapphire, AlN, as well as homoepitaxially on native GaN substrates, heteroepitaxial growth on non-native substrates always limits the thickness and quality of the epitaxial GaN film due to lattice and thermal mismatch with the substrate material. Even in the case of homoepitaxial growth on native GaN substrates, lift-off methods such as laser liftoff or spalling can significantly compromise the quality and particularly the uniformity of the transferred GaN film. While other methods of transfer of epitaxial GaN using sacrificial layers such as metallic NbN exist, the practical size of the transferred GaN film is severely limited, thus individual devices of only a few hundred micrometers can be transferred this way since the sacrificial NbN epitaxial layer (grown in between the to-be-transferred GaN film and the SiC substrate) is very thin owing to the low growth rate of that material. In contrast, the thickness of a Si-based sacrificial layer such as that used in accordance with the present invention can be much higher, and possible to engineer as well, allowing for chip or even wafer level release of quasi-freestanding crystalline GaN films of significant thickness.

The engineered substrates developed at NRL have made it possible to grow high quality low-stress GaN heteroepitaxial layers having a thickness that is roughly an order of magnitude thicker than is possible on other substrates, e.g., 2 µm on SiC versus 20 µm on the NRL engineered substrates. In turn, this property, combined with the presence of the Si sacrificial release layer, allows for release of chip- or wafer-sized thick GaN crystals and their transfer onto arbitrary substrates. One possible use of the present invention is the transfer of GaN released from engineered substrates onto diamond for thermal management.

As described in more detail below, the present invention provides methods for producing an epitaxial material layer having both a thickness and a lateral size that are larger than has previously been obtainable using conventional methods. The epitaxial material layer is grown on an engineered substrate and then is released from the engineered substrate via a sacrificial release layer. In some embodiments, the released epitaxial material layer produced in accordance with the present invention remain as a free-standing material layer, while in other embodiments, it can be transferred to another substrate such as diamond as part of an electronic device.

Figure 1:
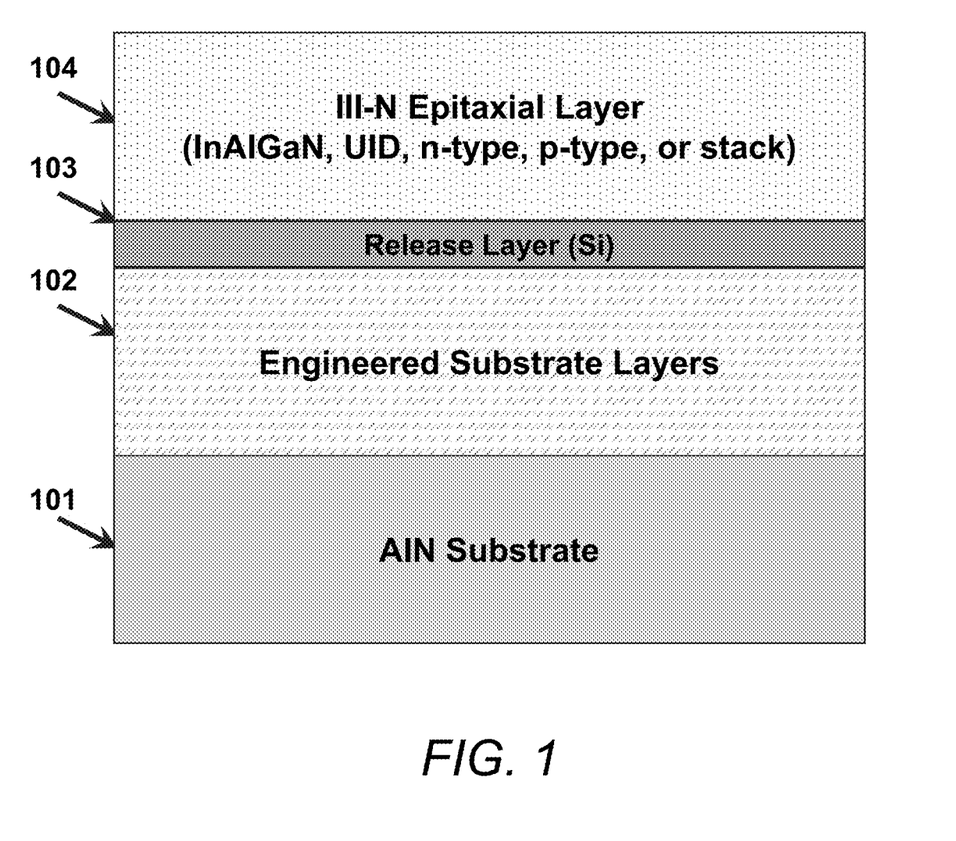
FIG. 1 is a block schematic illustrating an exemplary heterostructure that includes a sacrificial release layer sandwiched between one or more engineered substrate layers and an epitaxial material layer in accordance with one or more aspects of the present disclosure.

The block schematic in FIG. 1 illustrates an exemplary layer structure that can be used in the process for making a thick large-area epitaxial material sample in accordance with the present invention.

As illustrated in FIG. 1, such a layer structure includes a base substrate 101, one or more engineered substrate layers 102 grown on an upper surface of base substrate 101, a sacrificial release layer 103 grown on an upper surface of the engineered substrate layers 102, and an epitaxial material layer 104 grown on an upper surface of the sacrificial release layer 103.

It will be noted here that layers 101, 102, 103, and 104 are also labeled in the FIGURE as "Layer 1," "Layer 2," "Layer 3," and "Layer 4," and that corresponding layers shown in subsequent FIGURES will also be denoted as "Layer 1," etc. and will have the same structure or be composed of the same materials as described here with respect to FIG. 1, with additional layers (e.g., "Layer 5" shown in FIG. 3B) having the structure or materials as described with respect to those FIGURES.

Thus, in a layered structure for use in a method in accordance with the present invention, base substrate 101 can be any suitable material having a thermal match for GaN. In an exemplary embodiment, base substrate 101 can be polycrystalline AlN, but one skilled in the art will readily recognize that other materials can be used as well.

Engineered substrate layers 102 can be any suitable metal and/or dielectric materials that can enhance enhanced the strength of the bonded interface.

The sacrificial release layer 103 typically is a (111) Si layer providing a nucleation surface for GaN epitaxial growth. In many embodiments, sacrificial release layer 103 is a Si interlayer utilized in engineered substrate technology as an epitaxial template for III-N growth, formed by wafer bonding to the surface of an engineered substrate stack, though in other embodiments, any suitable material can be used for the sacrificial release layer.

Material layer 104 can take any one of numerous forms. It can be unintentionally doped (UID), intentionally n-type or p-type doped, or polarization-doped. In many embodiments, it will be a III-N material layer, for example, an InAlGaN film or a heterostructure incorporating a III-N material or a combination of III-N materials such as GaN, BN, InN, AlN, $Al_xGa_{1-x}N$ ($0 \le x \le 1$); $In_xAl_{1-x}N$ ($0 \le x \le 1$); $In_xAl_yGa_zN$ ($x+y+z=1$); $Sc_xAl_{1-x}$ ($0 \le x \le 1$); $B_xAl_{1-x}N$ ($0 \le x \le 1$); or $B_xAl_yGa_zN$ ($x+y+z=1$). In other embodiments, material layer 104 can also comprise a transition metal nitride (TMN) such as ZnN, WN, VaN, TaN, or NbN. Material layers comprising all such materials are deemed to be within the scope of the present disclosure.

After growth of a layer structure such as that shown in FIG. 1, as illustrated in FIGS. 2A-2B and FIGS. 3A-3E, the active structure can be released from the layered stack for use in device applications.

Figure 2A:
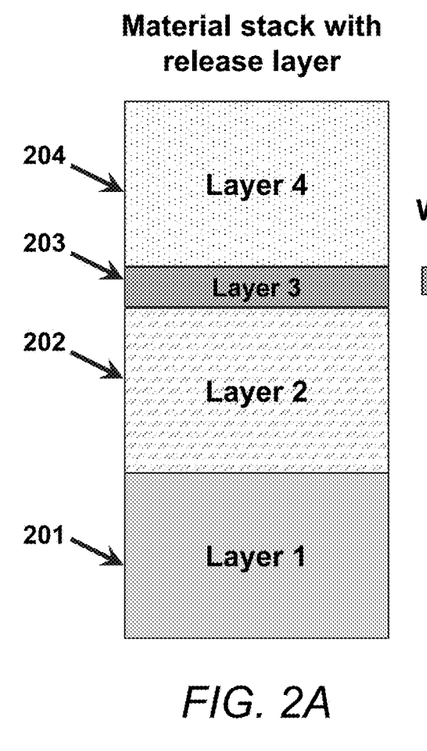
FIGS. 2A and 2B are block schematics illustrating aspects of a method for forming a free-standing III-Nitride structure in accordance with one or more aspects of the present disclosure.
Figure 2B:
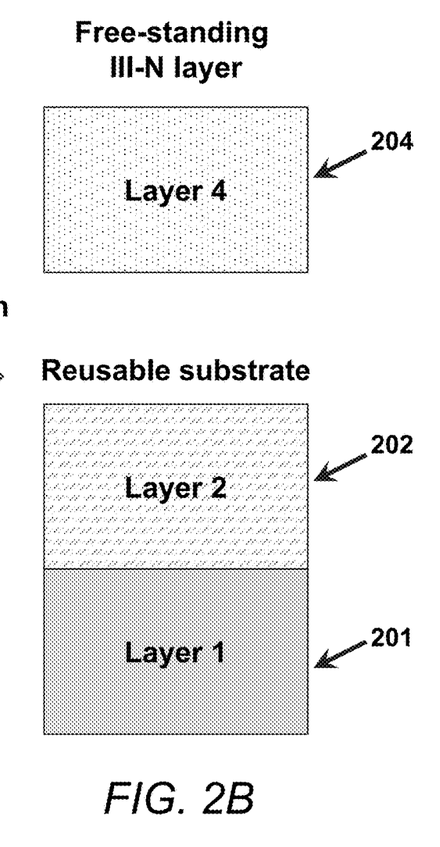

In vertical power device applications, it is desirable to minimize substrate resistance. By wet, dry, or vapor etching the release layer, a free standing III-N device structure can be formed, as shown in FIGS. 2A and 2B. In this embodiment, a free-standing thick (>5 μm) epitaxial material layer 204 can be obtained from a layer structure such as that shown in FIG. 2A, comprising layers 201, 202, 203, and 204 formed from Layers 1, 2, 3, and 4 as described above by etching the sacrificial release layer 203 from the structure, as illustrated in FIG. 2B. Etching can be done by any suitable etching process such as wet etching or $XeF_2$ dry etching. After etching, epitaxial material layer 204 is released from the stack to form a free-standing epitaxial material layer which can be transferred onto an arbitrary substrate with advantageous properties such as a a diamond layer having a thermal conductivity greater than 300 W/mK or used to form a freestanding vertical device. The prior art does not allow simultaneously the presence of engineered layers, originally designed and developed to enable the engineered substrate technology and hereby repurposed to be used as sacrificial release layers, and the presence of thick, thermal stress free epitaxial layers as can be produced in accordance with the present invention. In addition, the remaining base substrate layer 201 and engineered substrate layer 202 form a reusable substrate, which can again have a sacrificial release layer and a new epitaxial material layer grown thereon.

In other applications, it is desirable to place the epitaxial material layer on a high-performance substrate, such as diamond for high thermal conductivity or any other substrate suitable for the ultimate use to which the device will be made. In this embodiment, aspects of which are illustrated by the block schematics in FIGS. 3A-3E, the epitaxial material layer can be transferred to an arbitrary substrate after being released from the stack.

Figure 3A:
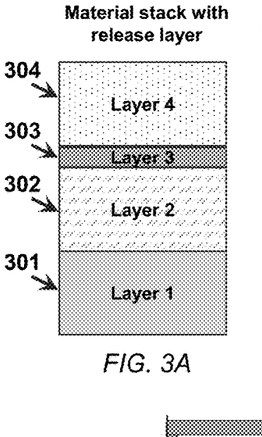
FIGS. 3A-3E are block schematics illustrating aspects of a method for forming an epitaxial material layer on an arbitrary substrate in accordance with one or more aspects of the present disclosure.
Figure 3B:
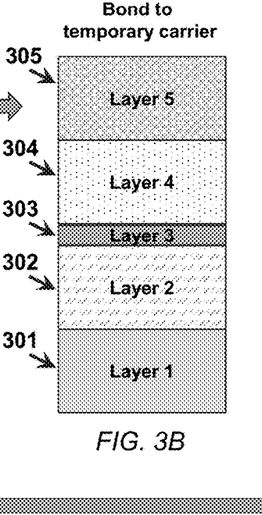
Figure 3C:
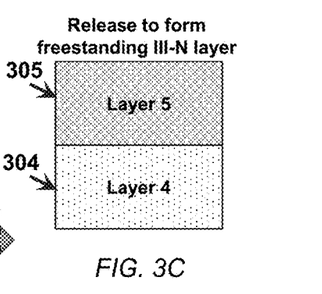

Thus, in this embodiment, the layered stack comprising layers 301, 302, 303, and 304 shown in FIG. 3A is bonded to a temporary carrier layer 305 that has been formed on an upper surface of epitaxial material layer 304, as shown in FIG. 3B. Bonding of temporary carrier layer 305 can be accomplished by any suitable means, such as by using a polymer, oxide, metal, or direct bond. After the temporary carrier layer is bonded to the epitaxial material layer, as shown in FIG. 3C, epitaxial material layer 304 with temporary carrier layer 305 bonded thereto is released by removing sacrificial release layer 303, e.g., by wet, dry, or vapor etching, to form a freestanding epitaxial material layer that, in accordance with the invention, can be transferred to another substrate.

Figure 3D:
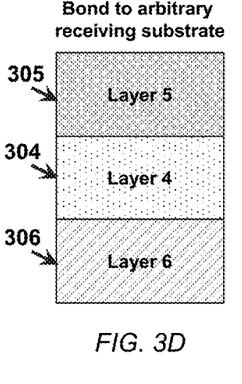

In a next step, as shown in FIG. 3D, released epitaxial material layer 304 and temporary carrier layer 305 can be bonded, e.g., via direct bonding with low interfacial damage, to an arbitrary substrate 306 on the opposite surface of epitaxial material layer 304 from the temporary carrier layer. This arbitrary substrate can be any substrate suitable for the application in which epitaxial material layer 304 is to be used, such as diamond or an engineered substrate comprising multiple layers.

Figure 3E:
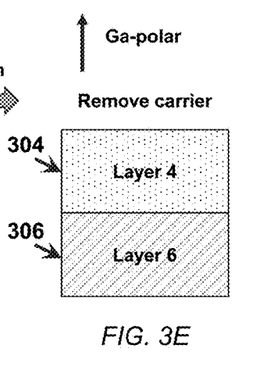

Finally, as illustrated by FIG. 3E, temporary carrier layer 305 is removed, e.g., by wet etching or any other suitable means, leaving epitaxial material layer 304 on arbitrary substrate 306 as the final structure.

In other embodiments, the epitaxial material layer can be bonded directly to a high-performance substrate instead of being bonded to a temporary carrier wafer. By selectively bonding the high-performance substrate to an upper surface or a lower surface of the released epitaxial material layer, the polarity of the resulting structure can be controlled. For example, in the case where the epitaxial material layer is GaN, growth of the epitaxial material layer on silicon results in a III-N layer having a Ga-polar top surface. However, N-polar devices are often preferred for use in mm-wave HEMT technologies because of their low electrical contact resistance, strong back-barrier, and improved scalability.

Figure 4:
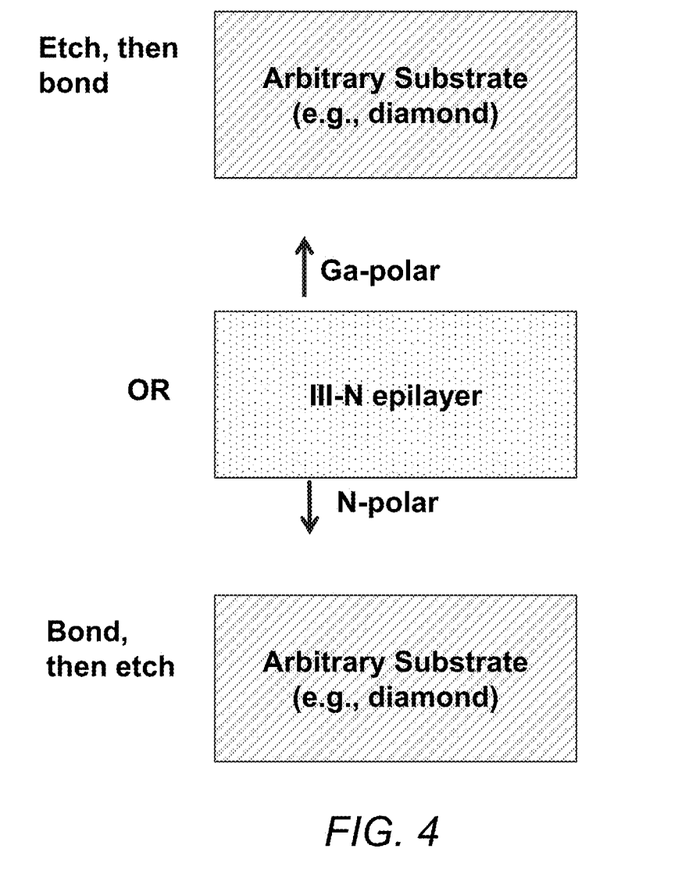
FIG. 4 is a block schematic illustrating the way in which the Ga- or N-polarity of a III-N epitaxial material layer can be engineered in accordance with one or more aspects of the present disclosure.

The block schematic in FIG. 4 illustrates an embodiment where an arbitrary substrate (e.g., diamond having a thermal conductivity >300 W/mK) is bonded to a Ga-polar III-N epitaxial material layer in lieu of a temporary carrier wafer. As a result, an inverted polarity (N-polar) III-N epitaxial material layer on arbitrary substrate can be created once the engineered layers are removed. Both of these approaches minimize or eliminate interfacial layers while simultaneously maximize III-N layer thickness and chip size.

Figure 5A:
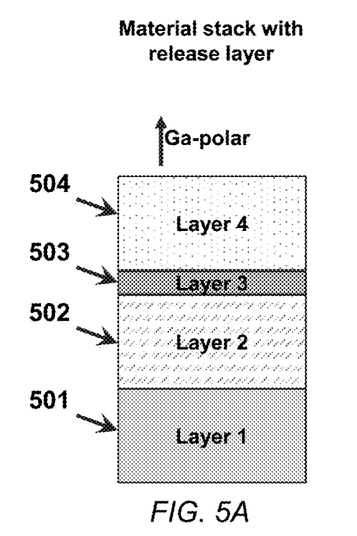
FIGS. 5A and 5B are block schematics illustrating aspects of a method for forming an N-polar III-N epitaxial material layer on an arbitrary high-performance substrate in accordance with one or more aspects of the present disclosure.
Figure 5B:
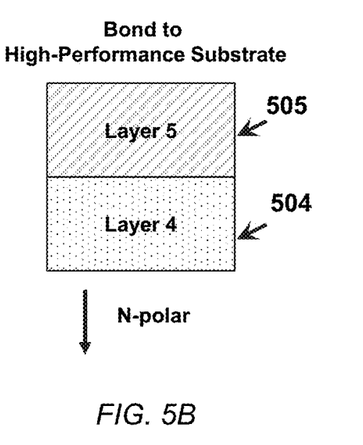

FIGS. 5A and 5B further illustrate the way in which the method of the present invention can be used to selectively form an N-polar III-N structure on an arbitrary substrate.

As illustrated in FIGS. 5A and 5B, a layer structure (FIG. 5A) comprising base substrate 501, engineered substrate 502, sacrificial release layer 503, and III-nitride layer 504 is grown as described above with respect to FIG. 1. The Ga-face of the III-nitride layer 504 is bonded to an arbitrary high performance substrate 505, then released from the structure, e.g., by wet etching of sacrificial release layer 503, as shown in FIG. 5B where an N-polar surface is left. Alternatively, as shown in FIGS. 3B-3E described above, the released N-polar III-nitride layer 304 is mounted onto an arbitrary substrate 306, which results in a Ga-polar structure upon removal of temporary carrier. One skilled in the art will readily recognize that the same procedure can be used to produce an N-polar material layer from other III-Nitride or TMN materials.

Thick III-N films produced in accordance were incorporated into electronic devices and their performance was evaluated.

Figure 6A:
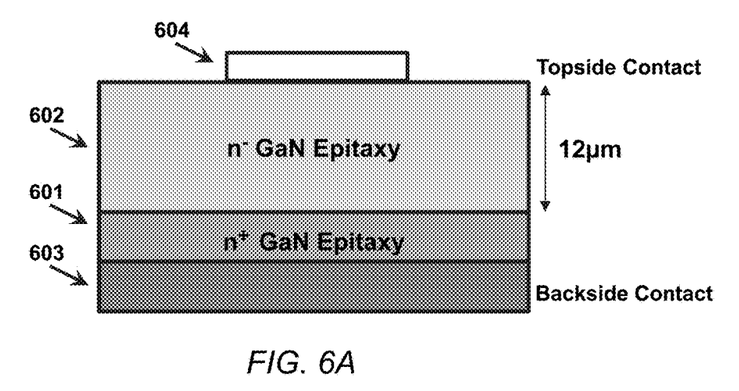
FIG. 6A illustrates a free-standing GaN vertical diode structure.
Figure 6B:
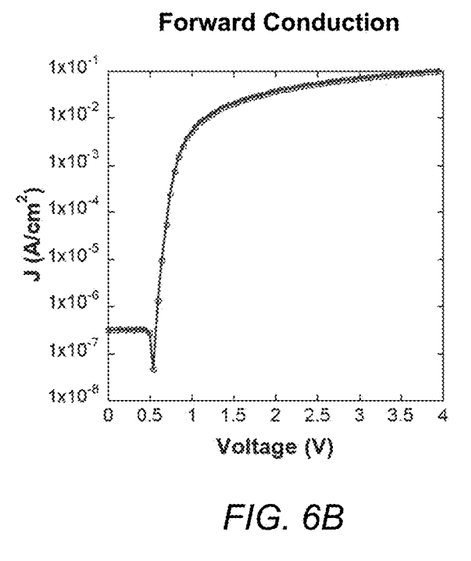
FIG. 6B illustrates electrical measurements in forward bias and FIG. 6C illustrates reverse blocking on such a structure.
Figure 6C:
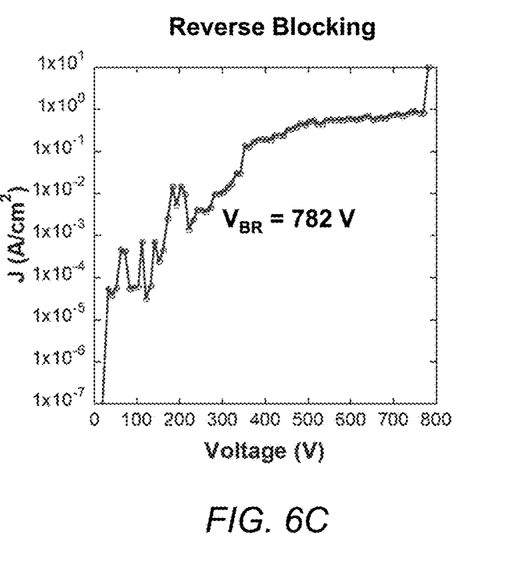

In one case, a free-standing GaN vertical diode such as that illustrated in FIG. 6A was fabricated, where the diode comprised an $n^+$ epitaxial GaN layer 601 with an $n^-$ epitaxial GaN layer 602 on an upper surface thereof, the diode further comprising a backside contact 603 on a backside of $n^+$ GaN layer 601 and a topside contact 604 on a top surface of $n^-$ GaN layer 602. The performance of this structure was evaluated, and the results are shown by the plots shown in FIGS. 6B for forward bias and 6C for reverse blocking voltage of this freestanding GaN Schottky diode.

Advantages and New Features

The main new feature introduced by the present invention is the ability to create an epitaxial material layer having a significant thickness (>5 μm) onto an arbitrary substrate. In one embodiment, if a 50 μm thick GaN epilayer is released from the substrate, a quasi-freestanding GaN wafer is created with this approach and then transferred onto an arbitrary substrate. None of the alternative technologies in existence can achieve this feature.

The fabrication approach of the present invention has several advantages. In one embodiment, the target substrate can be high thermal conductivity single crystal or polycrystalline diamond, whose coefficient of thermal expansion is too large to be able to grow epitaxial GaN directly. Such a GaN-on-diamond structure can be achieved either by diamond growth on either the N-polar or the Ga-polar side of the released quasi-freestanding GaN layer. Another approach is to bond to a diamond substrate by a wafer bonding or a similar transfer approach on a chip or wafer scale.

GaN HEMTs incorporating a thick GaN layer that is transferred to a thick CVD diamond substrate in accordance with the present invention provide significantly superior temperature management as compared to GaN devices on other materials.

Figure 7A:
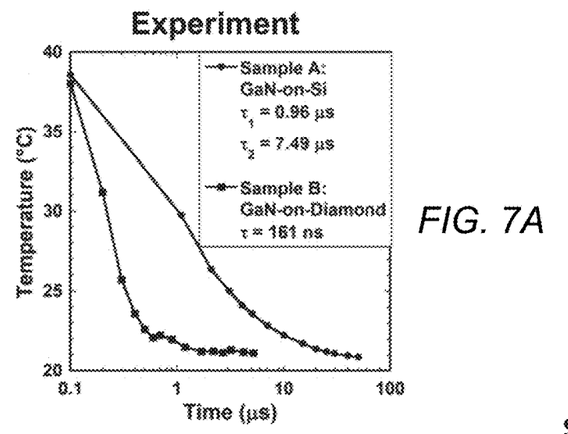
FIGS. 7A-7C are plots illustrating aspects of GaN HEMTs fabricated in accordance with the present invention.
Figure 7B:
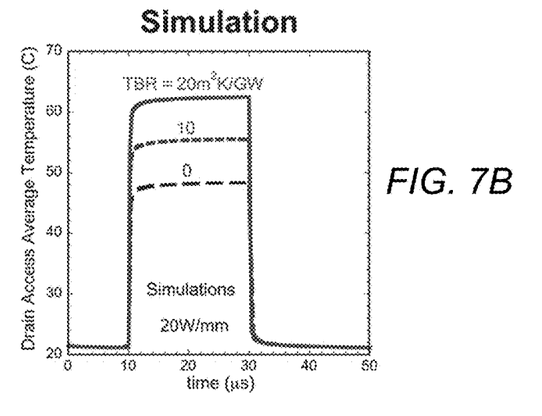
Figure 7C:
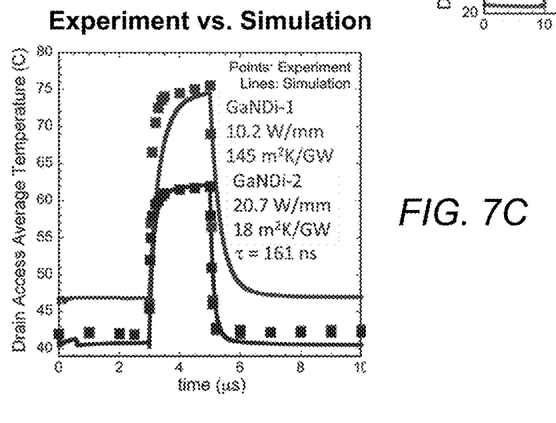

The plots in FIGS. 7A-7C illustrate this superior performance.

The plot in FIG. 7A compares the temperature of a HEMT having a GaN layer on a Si substrate vs. a HEMT having a thick GaN layer on a diamond substrate, and show that the GaN-on-Diamond HEMT exhibited a significantly lower (up to 6× lower) temperature at any given time as compared to the GaN-on-Si HEMT.

The plot in FIG. 7A compares average thermal decay of GaN HEMTs on Silicon (Sample A) and diamond (Sample B) substrates. It can be seen that the thermal decay time constant τ is about an order of magnitude lower for sample B, suggesting much faster cooling rate for that sample. This is due to the higher thermal conductivity of the diamond substrates and also the improved thermal boundary resistance (TBR) of the barrier between GaN and diamond in sample B. FIG. 7B illustrates via simulation the effect of improving TBR (from 20 m²K/GW down to 0) on average temperature during transient switching. This effect was particularly pronounced when comparing two generations of GaN-on-diamond technology (FIG. 7C) where a much higher quality boundary layer in sample GaNDi-2 resulted in significantly lower drain access average temperature and thermal boundary resistance, even at twice the power level. See Marko J. Tadjer et al., "GaN-On-Diamond HEMT Technology With TAVG=176° C. at $P_{DC,max}$=56 W/mm Measured by Transient Thermoreflectance Imaging," *IEEE Electron Device Letters,* vol. 40, no. 6, pp. 881-884, June 2019.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A method for producing a thick epitaxial material layer on an arbitrary receiving substrate, comprising:
   providing a base substrate, the base substrate having a thermal coefficient of expansion that matches a thermal coefficient of expansion of a predetermined epitaxial material;
   depositing an engineered substrate on the base substrate, the engineered substrate comprising a multilayered structure that is engineered to have a thermal coefficient of expansion that matches the thermal coefficient of expansion of the predetermined epitaxial material;
   depositing a sacrificial release layer having an atomically flat surface on the engineered substrate, the sacrificial release layer providing a nucleation surface for epitaxial growth of the predetermined epitaxial material;
   epitaxially growing the predetermined epitaxial material on the sacrificial release layer, a match of the thermal coefficient of expansion between the engineered substrate and the predetermined epitaxial material enabling growth of a thick epitaxial material layer without cracking of the epitaxial material, the thick epitaxial material layer having a thickness greater than 5 μm;
   bonding a temporary carrier layer to an upper surface of the thick epitaxial material layer;
   removing the sacrificial release layer, the engineered substrate, and the base substrate from the bottom of the thick epitaxial material layer to form a freestanding thick epitaxial material layer;
   bonding a bottom surface of the freestanding thick epitaxial material layer to a predetermined arbitrary receiving substrate; and
   removing the temporary carrier layer from the upper surface of the freestanding material layer, the thick material layer being thereby situated on the receiving substrate.

2. The method according to claim 1, wherein the predetermined epitaxial material comprises a III-Nitride material, a heterostructure including a III-Nitride material, or a transition metal nitride (TMN).

3. The method according to claim 1, wherein the predetermined epitaxial material comprises GaN, BN, InN, AlN, $Al_xGa_{1-x}N$ (0≤x≤1), $In_xAl_{1-x}N$ (0≤x≤1), $In_xAl_yGa_zN$ (x+y+z=1), $Sc_xAl_{1-x}N$ (0≤x≤1), $B_xAl_{1-x}N$ (0≤x≤1), or $B_xAl_yGa_zN$ (x+y+z=1).

4. The method according to claim 1, wherein the predetermined epitaxial material comprises ZnN, WN, VaN, TaN, or NbN.

5. The method according to claim 1, wherein the sacrificial layer is a (111) Si layer providing a nucleation surface for epitaxial growth of the thick epitaxial material layer.

6. The method according to claim 1, wherein the base substrate comprises polycrystalline AlN.

7. The method according to claim 1, wherein the receiving substrate is a diamond layer having a thermal conductivity greater than 300 W/mK.

8. A method for producing a thick epitaxial material layer having a predetermined polarity on an arbitrary substrate, comprising:
   providing a base substrate, the base substrate having a thermal coefficient of expansion that matches a thermal coefficient of expansion of a predetermined epitaxial material;

depositing an engineered substrate on the base substrate, the engineered substrate comprising a multilayered structure that is engineered to have a thermal coefficient of expansion that matches the thermal coefficient of expansion of the predetermined epitaxial material;

depositing a sacrificial release layer having an atomically flat surface on the engineered substrate, the sacrificial release layer providing a nucleation surface for epitaxial growth of the predetermined epitaxial material;

epitaxially growing the predetermined epitaxial material on the sacrificial release layer, a match of the thermal coefficient of expansion between the engineered substrate and the predetermined epitaxial material enabling growth of a thick epitaxial material layer without cracking of the epitaxial material, the thick epitaxial material layer having a thickness greater than 5 μm;

removing the sacrificial release layer, the engineered substrate, and the base substrate from the bottom of the thick epitaxial material layer to form a freestanding thick epitaxial material layer;

bonding a top or a bottom surface of the freestanding thick epitaxial material layer to a predetermined arbitrary receiving substrate;

wherein the sacrificial release layer is selected to produce a predetermined polarity in the thick epitaxial material layer grown on the sacrificial release layer; and wherein the top or bottom bonding surface is selected to produce the predetermined polarity of the thick epitaxial material layer on the arbitrary substrate.

9. The method according to claim 8, wherein the predetermined epitaxial material comprises a III-Nitride material, a heterostructure including a III-Nitride material, or a transition metal nitride (TMN).

10. The method according to claim 8, wherein the predetermined epitaxial material comprises GaN, BN, InN, AlN, $Al_xGa_{1-x}N$ ($0 \leq x \leq 1$), $In_xAl_{1-x}N$ ($0 \leq x \leq 1$), $In_xAl_yGa_zN$ ($x+y+z=1$), $Sc_xAl_{1-x}(0 \leq x \leq 1)$, $B_xAl_{1-x}N$ ($0 \leq x \leq 1$), or $B_xAl_yGa_zN$ ($x+y+z=1$).

11. The method according to claim 8, wherein the predetermined epitaxial material comprises ZnN, WN, VaN, TaN, or NbN.

12. The method according to claim 8, wherein the sacrificial layer is a (111) Si layer providing a nucleation surface for epitaxial growth of the thick epitaxial material layer.

13. The method according to claim 8, wherein the base substrate comprises polycrystalline AlN.

14. The method according to claim 8, wherein the receiving substrate is a diamond layer having a thermal conductivity greater than 300 W/mK.

15. A method for producing a thick N-polar epitaxial GaN material layer on an arbitrary substrate, comprising:
providing a base substrate, the base substrate having a thermal coefficient of expansion that matches a thermal coefficient expansion of GaN;
depositing an engineered substrate on the base substrate, the engineered substrate comprising a multilayered structure that is engineered to have a thermal coefficient of expansion that matches the thermal coefficient of expansion of the GaN;
depositing a (111) Si sacrificial release layer having an atomically flat surface on the engineered substrate, the sacrificial release layer providing a nucleation surface for epitaxial growth of the GaN;
epitaxially growing a layer of GaN having a Ga-polar top surface on the sacrificial release layer, a match of the thermal coefficient of expansion between the engineered substrate and the GaN enabling growth of a thick epitaxial GaN layer without cracking, the thick epitaxial GaN layer having a thickness greater than 5 μm;
bonding the Ga-polar top surface of the thick epitaxial GaN layer to a predetermined arbitrary receiving substrate; and
removing the sacrificial release layer, the engineered substrate, and the base substrate from the bottom of the bonded thick epitaxial GaN layer to form an N-polar GaN having a thickness greater than 5 μm on the arbitrary substrate.

16. The method according to claim 15, wherein the receiving substrate is a diamond layer having a thermal conductivity greater than 300 W/mK.

17. A method for producing a thick Ga-polar epitaxial GaN material layer on an arbitrary substrate, comprising:
providing a base substrate, the base substrate having a thermal coefficient of expansion that matches a thermal coefficient expansion of GaN;
depositing an engineered substrate on the base substrate, the engineered substrate comprising a multilayered structure that is engineered to have a thermal coefficient of expansion that matches the thermal coefficient of expansion of the GaN;
depositing a sacrificial release layer having an atomically flat surface on the engineered substrate, the sacrificial release layer providing a nucleation surface for epitaxial growth of GaN;
epitaxially growing a layer of GaN having an N-polar top surface on the sacrificial release layer, a match of the thermal coefficient of expansion between the engineered substrate and the GaN enabling growth of a thick epitaxial GaN layer without cracking, the thick epitaxial GaN layer having a thickness greater than 5 82 m;
bonding the N-polar top surface of the epitaxial GaN layer to a predetermined arbitrary receiving substrate; and
removing the sacrificial release layer, the engineered substrate, and the base substrate from the bottom of the bonded GaN layer to form a Ga-polar GaN having a thickness greater than 5 μm on the arbitrary substrate.

18. The method according to claim 17, wherein the receiving substrate is a diamond layer having a thermal conductivity greater than 300 W/mK.

* * * * *